(12) United States Patent
Sunahara

(10) Patent No.: US 6,225,392 B1
(45) Date of Patent: *May 1, 2001

(54) CONDUCTIVE PASTE

(75) Inventor: Kazuo Sunahara, Yokohama (JP)

(73) Assignee: Asahi Glass Company Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/855,949

(22) Filed: May 14, 1997

(30) Foreign Application Priority Data

May 15, 1996 (JP) .................................................. 8-120557

(51) Int. Cl.[7] ........................................................ C03C 8/00
(52) U.S. Cl. ..................... 524/404; 252/508; 252/518.1; 252/519.14; 252/520.3; 252/514; 252/519.33; 106/1.14; 501/18; 501/21
(58) Field of Search ............................. 524/404; 252/508, 252/518.1, 519.14, 520.3, 519.33, 514; 106/1.14; 501/18, 21

(56) References Cited

U.S. PATENT DOCUMENTS

| 4,636,254 | * | 1/1987 | Hassan, Jr. et al. | 106/1.14 |
| 4,906,596 | * | 3/1990 | Joslin et al. | 501/17 |
| 5,066,620 | * | 11/1991 | Sunahara et al. | 501/21 |

FOREIGN PATENT DOCUMENTS 57-41763   9/1982   (JP) .

OTHER PUBLICATIONS

Derwent Abstract of JP 57–41763 (Central Glass Co.), Sep. 1982.*

* cited by examiner

Primary Examiner—Terrell Morris
Assistant Examiner—John J. Guarriello
(74) Attorney, Agent, or Firm—Oblon, Spivak, McClelland, Maier & Neustadt, P.C.

(57) ABSTRACT

A conductive paste comprising conductive powder and low-melting glass frit, wherein the low-melting glass frit constituting the conductive paste crystallizes crystals during firing to increase the resistivity of the conductive paste.

9 Claims, No Drawings

CONDUCTIVE PASTE

BACKGROUND OF THE INVENTION

1. Field of the Invention

The present invention relates to a conductive paste containing silver as the main component. Particularly, it relates to a conductive paste which is printed on a substrate and fired to form an electric conductor.

2. Discussion of Background

As a method for preventing fogging of a rear window glass of an automobile, a method has been employed wherein a conductive paste is printed on the glass surface to form a plurality of conductive strips for heating and bus bars connected to both ends of the strips and then fired to form an electric conductor, and metallic terminals for lead wires are attached to the bus bars by soldering, and a voltage is applied across the metallic terminals, so that the surface temperature of the glass is maintained at a level higher than the dew point by heat generation of the conductor.

In this case, a constant voltage power source is used, and the heating value is accordingly governed by the resistivity of the conductor. Accordingly, in order to control the amount of heat exerted to a unit area of glass to be constant irrespective of the shape of the glass, electric conductors are required which have various resistivities and to which metallic terminals can be soldered.

Heretofore, as a method for forming such conductors, a method has been known as disclosed in JP-B-57-41763 in which silver powder, low-melting glass frit and an organic varnish are mixed to obtain a paste, which is then fired to a glass plate, and then copper is electroplated to adjust the resistivity.

However, the electroplating treatment has had problems with respect to the operation efficiency and costs, since the number of process steps thereby increases, although desired levels of the resistivity and bond strength with the metallic terminals can be obtained.

Further, it has been proposed to incorporate a metal oxide or a metal having high resistivity such as Ni, Al, Sn, Pb, Pt or Pb as a resistivity-controlling agent to the above mentioned paste, without carrying out such electroplating.

However, when such a resistivity-controlling agent is used, there has been a drawback that the bond strength to the metallic terminals can not be adequately increased. The reason is considered to be such that when the above mentioned metal or its oxide is added as a resistivity-adjusting agent, sintering of silver particles will be hindered, and the sintered structure of silver will be coarse, and accordingly, when metal terminals are soldered thereto, the solder tends to erode the grain boundaries of silver, and silver tends to melt in the solder, whereby the silver structure will be broken, thus leading to so-called solder-erosion defects, whereby the bond strength is believed to deteriorate. Even if the solder-erosion phenomenon does not occur, the silver structure breakage is still likely to occur, since the sintered structure of silver is coarse, whereby the bond strength tends to be poor.

It has been proposed to incorporate an organic rhodium compound in order to overcome such a drawback (JP-B-57-41763). However, such a proposal has a drawback from the viewpoint of costs, since the organic rhodium compound is expensive.

SUMMARY OF THE INVENTION

It is an object of the present invention to provide a conductive paste anew, whereby the resistivity can easily be adjusted, and high bond strength is obtainable between the conductor and the metallic terminals for lead wires.

The present invention provides a conductive paste comprising conductive powder and low-melting glass frit, wherein the low-melting glass frit constituting the conductive paste crystallizes crystals during firing to increase the resistivity of the conductive paste.

DETAILED DESCRIPTION OF THE PREFERRED EMBODIMENTS

Now, the present invention will be described in detail.

The low-melting glass frit constituting the conductive paste of the present invention is a constituent which bonds the conductive powder governing electrical conductivity to the substrate glass or to a ceramic color layer formed on the substrate glass, and as such, it is essential to the present invention.

In the present invention, the low-melting glass frit crystallize at least one type of crystals. The crystals to be crystallized are preferably crystals of at least one member selected from lead titanate, lead zirconate, lead borate and lead stannate. These crystal components will be crystallized in the form of crystals in a temperature range of from 570 to 700° C. as the temperature for bending a glass sheet for an automobile. It is advantageous that the conductive paste can be fired at the same time as the glass bending operation.

Such crystals crystallized from low-melting glass frit, will be present in grain boundaries of silver to hinder the electrical conductivity of the silver grain boundaries, thus providing an effect for increasing the resistivity. Namely, it is possible to adjust the resistivity to a desired level by controlling the amount of crystals crystallized from the low-melting glass frit.

In general, the resistivity can be increased by increasing the amount of titanium, zirconium, tin or boron as a constituting element of crystals and the amount of lead as the other constituting component. Further, such crystals will be crystallized by the reaction with lead. Accordingly, it is possible to increase the amount of crystallized crystals and increase the resistivity also by lowering the glass transition temperature at which the reaction starts.

In the present invention, two or more different types of the above mentioned crystals may be crystallized, and crystals other than those described above may also be crystallized. The effect of increasing the resistivity can be obtained, if crystallization takes place to such an extent that crystallization of crystals can be ascertained by a mineral X-ray analyzer.

With a view to facilitating crystallization of crystals, the low-melting glass frit of the present invention preferably has substantially the following composition:

| | |
|---|---|
| PbO | 65 to 85 wt %, |
| $B_2O_3$ | 5 to 13 wt %, |
| $SiO_2$ | 2 to 7 wt %, |
| $TiO_2$ | 0 to 20 wt %, |
| $ZrO_2$ | 0 to 15 wt %, |
| $SnO_2$ | 0 to 15 wt %, |
| $TiO_2 + ZrO_2 + SnO_2$ | 3 to 25 wt %, |
| $Al_2O_3 + Ce_2O_3$ | 0.1 to 2 wt %, |
| $Li_2O_3 + Na_2O + K_2O$ | 0 to 1 wt %, |
| $MgO + CaO + SrO + BaO$ | 0 to 5 wt %, and |
| $P_2O_5$ | 0 to 3 wt %. |

PbO is essential in this preferred composition as a flux component and a component for crystallization. If it is less than 65 wt %, the softening temperature of glass tends to be high, and if it exceeds 85 wt %, the chemical durability tends to deteriorate. It is preferably from 68 to 83 wt %, more preferably from 70 to 80 wt %.

$B_2O_3$ is essential in this preferred composition as a flux component and a component for crystallization. If it is less than 5 wt %, the softening temperature of glass tends to be high, and if it exceeds 13 wt %, the chemical durability tends to deteriorate. It is preferably from 8 to 12 wt %, more preferably from 10 to 12 wt %.

$SiO_2$ is a network former of glass and an essential component in this preferred composition for controlling the chemical, thermal and mechanical properties. If it is less than 2 wt %, the chemical durability tends to be poor, and if it exceeds 7 wt %, the glass softening point tends to be high, and the effect for bonding silver to the primer ceramics color layer tends to be low. It is preferably from 3 to 6 wt %.

At least one member selected from $TiO_2$, $ZrO_2$ and $SnO_2$ is essential in this preferred composition to improve the chemical durability and crystallization of crystals during baking. If their total amount is less than 3 wt %, the chemical durability tends to be poor, and crystallization tends to be difficult during the firing. If their total amount exceeds 25 wt %, devitrification tends to result during melting of glass. Preferably, their total amount is from 4 to 15 wt %.

Among them, if $TiO_2$ exceeds 20 wt %, the glass transition temperature tends to be too high, and not only crystallization of crystals at a temperature for the glass bending operation will be hindered, but also the adhesion of silver powder to glass may deteriorate. When it is contained in an amount of at least 3 wt %, the desired crystals can be crystallized under a stabilized condition. It is preferably from 3 to 20 wt %, more preferably from 5 to 17 wt %.

If $ZrO_2$ exceeds 15 wt %, the glass transition temperature tends to be too high, and not only crystallization of crystals at a temperature for the glass bending operation will be hindered, but also the bond strength of the silver powder to glass may deteriorate. When it is incorporated in an amount of at least 3 wt %, the desired crystals can be crystallized under a stabilized condition. It is preferably from 3 to 15 wt %, more preferably from 5 to 10 wt %.

If $SnO_2$ exceeds 15 wt %, the glass transition temperature tends to be too high, and not only crystallization of crystals at a temperature for the glass bending operation will be hindered, but also the bond strength of the silver powder to glass may deteriorate. When it is incorporated in an amount of at least 3 wt %, the desired crystals can be crystallized under a stabilized condition. It is preferably from 3 to 15 wt %, more preferably from 5 to 10 wt %.

At least one of $Al_2O_3$ and $Ce_2O_3$ is essential in this preferred composition to improve the chemical durability. If their total amount is less than 0.1 wt %, no adequate effects tend to be obtained, and if it exceeds 2 wt %, the glass softening temperature tends to be too high. Their total amount is preferably from 0.5 to 1 wt %.

$Li_2O_3$, $Na_2O$ and $K_2O$ are not essential components, but may be incorporated in a total amount of up to 1 wt %, as a flux component. If the total amount exceeds 1 wt %, the thermal expansion coefficient tends to be large. The total amount is preferably from 0 to 0.5 wt %.

MgO, CaO, SrO and BaO are not essential components, but may be incorporated in a total amount of up to 5 wt % to improve the meltability and to control the thermal expansion coefficient. If the total amount exceeds 5 wt %, the chemical durability tends to deteriorate. The total amount is preferably from 0 to 3 wt %, more preferably from 0 to 2 wt %.

$P_2O_5$ is not an essential component, but may be incorporated in an amount of up to 3 wt % for the purpose of improving the chemical durability (particularly acid resistance). If the amount exceeds 3 wt %, devitrification is likely to result during melting of glass. It is preferably from 0 to 2 wt %.

The low-melting glass frit having the above described composition is crystallizable glass which crystallizes at least one of lead titanate, lead zirconate, lead borate and lead stannate mainly as crystals in a temperature range of from 570 to 700° C.

Such a temperature range corresponds to the temperature range for the bending operation of soda lime silicate glass useful as a window glass for vehicles. Accordingly, the conductive paste containing the low-melting glass frit powder of the present invention has an effect of increasing the resistivity by crystallizing at least one of lead titanate, lead zirconate, lead borate and lead stannate as main crystals in the grain boundaries of silver during the glass bending operation and thereby hindering the electrical conductivity of the silver grain boundaries. Therefore, when a high resistivity is required, it is not necessary to make the sintered tissue structure of silver to be coarse, and high bond strength can be obtained by a dense tissue structure of silver.

The conductive paste of the present invention comprises the conductive powder such as silver powder preferably in an amount of from 70 to 99 wt %, more preferably from 80 to 97 wt %, the low-melting glass frit preferably in an amount of from 1 to 30 wt %, more preferably from 1 to 27 wt %, most preferably from 2 to 5 wt %, and refractory filler powder preferably in an amount of from 0 to 30 wt %, more preferably from 0 to 10 wt %, most preferably from 1 to 2 wt %.

To these inorganic components, an organic vehicle is added to impart the printability to obtain a paste. The amount of the organic vehicle may optionally be adjusted depending upon the printing method, but is usually from 3 to 50 wt %, preferably from 3 to 20 wt %, based on the entire conductive paste.

The conductive powder constituting the conductive paste is a constituent governing the electrical conductivity and is an essential component. As the conductive powder, silver powder is representative.

In consideration of the printability of the paste, the average particle size of the conductive powder (silver powder) is preferably at most 20 $\mu$m, more preferably from 0.1 to 10 $\mu$m, most preferably from 0.1 to 6 $\mu$m. Such silver powder may be a mixture of two or more powders having different average particle sizes, or two or more foil shaped powders to control the printability or the sintering property. Further, a powder of an conductive metal other than silver, such as gold, platinum, palladium or rhodium, may be added to control the resistivity or the solder-erosion defects.

Further, refractory filler powder may be incorporated to such a conductive paste for the purpose of controlling the thermal expansion coefficient or controlling the strength of the conductive film after firing, although such a filler powder is not essential. If such refractory filler powder exceeds 30 wt %, it tends to impair sintering of the conductive powder such as silver powder. Such refractory filler powder may, for example, be a powder of α-alumina, α-aquartz, zircon, cordierite or forsterite.

The conductive paste of the present invention will be formed into a paste by incorporating an organic vehicle to the above described inorganic components for the conductive paste. Such an organic vehicle is not particularly limited so long as it is an organic resin effective for imparting printability. It may be the one having a commercially readily available resin such as an ethylcellulose resin, an acrylic resin, a styrene resin or a phenol resin dissolved in a solvent such as α-terpineol, butylcarbitol acetate, or a phthalic acid ester.

A method for producing a curved glass plate for a vehicle using the conductive paste of the present invention will be as follows. Firstly, the above described conductive paste is coated at a desired portion on the surface of a glass plate to be used as a window glass for a vehicle, by a coating means such as screen printing. This glass plate is usually made of soda lime silicate glass. Further, if necessary, a ceramic color paste may preliminarily be coated at the portion for coating.

Then, the glass plate coated with the conductive paste is dried and then heated in a heating furnace. This temperature is within a range of from 500 to 620° C., and at such a temperature, the conductive paste fuses to the glass plate.

Then, the glass plate is further maintained at a temperature of from 600 to 700° C., whereby the fused conductive paste is baked to the glass plate, and at the same time, the glass plate is subjected to bending by a press apparatus provided in the furnace or by a forming apparatus such as a vacuum saction forming apparatus. The die for such a press apparatus or a vacuum saction forming apparatus is usually made of a stainless steel covered with a glass fiber cloth, and the glass plate is pressed via this cloth. The bent glass plate is annealed or quenched for reinforcement to obtain a window glass for a vehicle.

Now, the present invention will be described in further detail with reference to Examples. However, it should be understood that the present invention is by no means restricted by such specific Examples.

EXAMPLES 1 TO 13

Materials were mixed to obtain glass compositions (unit: wt %) as identified in Tables 1 and 2. Each mixture was heated and melted at 1500° C. in a platinum crucible for vitrification. Then, the molten glass was cooled by a rotary roll, formed into frakes and pulverized by a ballmill to an average particle size of from 3 to 5 µm. Here, with respect to the composition wherein refractory filler powder was incorporated, the refractory filler powder was put into the ballmill together with the glass frakes, followed by mixing. In Examples, α-alumina was used as the refractory filler.

Then, silver powder, low-melting glass powder and an organic vehicle were mixed to obtain paste compositions (unit: wt %) as identified in Tables 1 and 2. Each mixture was kneaded for one hour in a porcelain mortar and dispersed three times by a three roll mill to obtain a silver paste.

The prepared silver paste was printed on a glass plate by a screen printing machine and dried at 120° C. for 10 minutes. Then, it was fired in an electric furnace at 680° C. for 5 minutes to obtain a silver conductor film. With respect to the obtained silver conductor film, identification of crystallized crystals and measurement of the crystallinity, the terminal strength, the resistivity of the silver conductor film and the acid resistance, were carried out, and the results are shown in Tables. Examples 1 to 8 represent the present invention, and Examples 9 to 11 represent Comparative Examples. The methods for measurements were as follows.

a) Identification of Crystallized Crystals and Crystallinity

The low-melting glass was subjected to measurement by mineral X-ray analyzer (CuKα, Ni filter) manufactured by Rigaku Denki K.K. at 2θ=20 to 90° to identify the crystallized crystal phase. In the Tables, N.D. indicates that the amount is lower than the detectable limit.

Further, 30 wt % of metal silicon was mixed to the low-melting glass powder after firing, and the ratio of the intensity of the (100) refraction peak of silicon to the intensity of the (100) refraction peak of the crystallized crystal in the low-melting glass, was measured to obtain the crystallinity. In this case, the firing temperature was varied, and the maximum peak intensity of the crystallized crystals was taken as 100% crystallinity. When more than two types of crystals were crystallized, the sum of the respective crystallinities was indicated.

b) Terminal Strength

A metallic terminal (tin-plated copper) with a bonding area of 50 mm$^2$ was soldered by a 6/4 solder for 5 seconds at a trowel temperature of 340° C. on the printed and fired conductive paste, whereupon the bond strength in a vertical direction was measured.

c) Resistivity

Three linear strips with a width of 1 mm and a length of 200 mm were printed with the conductive paste and fired, whereupon the cross sectional area was measured by the surface roughness meter, manufactured by Tokyo Seimitsu K.K., and the resistance was measured by a digital multimeter, manufactured by Kabushiki Kaisha Advantest, and the volume resistance i.e. the resistivity of the conductive paste was calculated.

d) Acid Resistance

The printed and baked conductive paste was immersed in 0.1 N H$_2$SO$_4$ for 24 hours, whereupon the terminal strength was measured. Symbol ○ indicates that the terminal strength was at least 15 kg, Symbol Δ indicates that the terminal strength was at least 10 kg and less than 15 kg, and Symbol × indicates that the terminal strength was less than 10 kg.

As is evident from the Tables, with the conductive composition of the present invention, the resistivity can be controlled by crystallization of crystals.

Further, using glass powder having the glass composition of Example 7, conductive pastes were prepared to have the paste compositions of Examples 12 and 13 as identified in Table 3, and the evaluations were carried out in the same manner as in Examples 1 to 11.

TABLE 3

| Composition (wt %) | 12 | 13 |
|---|---|---|
| Silver powder | 69.0 | 60.6 |
| Glass powder | 1.7 | 1.5 |
| Organic vehicle | 27.6 | 36.4 |
| Refractory filler | 1.7 | 1.5 |

The state of crystallization of crystals and the properties given in Tables 1 and 2 were not different from Example 7, but the printing property was different. Namely, Example 13 has a drawback that as compared with Example 7, the resolution in printing is low, but it has a merit in that at the time of printing over a large surface area, thining or line breakage scarcely occurs. Further, Example 14 has a drawback that as compared with Example 7, the resolution in printing is low, but has merits in that at the time of printing over a large surface area, thining or line breakage scarcely occurs, and printability of narrow lines with a width of not more than 200 µm will be improved.

TABLE 1

| Composition (wt %) | | 1 | 2 | 3 | 4 | 5 | 6 |
|---|---|---|---|---|---|---|---|
| Paste composition | Silver powder | 82 | 82 | 82 | 82 | 82 | 82 |
| | Glass powder | 2 | 2 | 2 | 2 | 2 | 2 |
| | Organic vehicle | 16 | 16 | 16 | 16 | 16 | 16 |
| | Refractory filler | 0 | 0 | 0 | 0 | 0 | 0 |
| Glass composition | PbO | 71 | 80 | 75 | 71 | 71 | 71 |
| | $B_2O_3$ | 11 | 10 | 10 | 11 | 11 | 11 |
| | $SiO_2$ | 5 | 3 | 5.5 | 5 | 7 | 7 |
| | $TiO_2$ | 10 | 0 | 2 | 5 | 4 | 0 |
| | $ZrO_2$ | 1 | 3 | 3 | 6 | 0 | 10 |
| | $SnO_2$ | 1 | 0.5 | 0.5 | 1 | 4 | 0 |
| | $Al_2O_3$ | 1 | 0 | 1 | 1 | 1 | 0 |
| | $Ce_2O_3$ | 0 | 0.5 | 0 | 0 | 0 | 1 |
| | $Na_2O$ | 0 | 0 | 0.5 | 0 | 0 | 0 |
| | CaO | 0 | 1 | 0 | 0 | 0 | 0 |
| | SrO | 0 | 2 | 0 | 0 | 0 | 0 |
| | $P_2O_5$ | 0 | 0 | 2.5 | 0 | 0 | 0 |
| Crystallized crystals | Lead titanate | Present | N.D. | Present | Present | Present | N.D. |
| | Lead zirconate | N.D. | Present | Present | Present | N.D. | Present |
| | Lead borate | N.D. | N.D. | N.D. | N.D. | N.D. | N.D. |
| | Lead stannate | N.D. | N.D. | Present | N.D. | Present | N.D. |
| Terminal strength | | At least 20 kg | At least 20 kg | At least 20 kg | At least 20 kg | At least 20 kg | At least 20 kg |
| Resistivity ($\mu\Omega \cdot$ cm) | | 13 | 5 | 8 | 10 | 9 | 6 |
| Acid resistance | | ○ | ○ | ○ | ○ | ○ | ○ |
| Crystallinity (%) | | 90 | 30 | 60 | 75 | 70 | 40 |

TABLE 2

| Composition (wt %) | | 7 | 8 | 9 | 10 | 11 |
|---|---|---|---|---|---|---|
| Paste composition | Silver powder | 80 | 50 | 82 | 82 | 82 |
| | Glass powder | 2 | 2 | 2 | 2 | 2 |
| | Organic vehicle | 16 | 16 | 16 | 16 | 16 |
| | Refractory filler | 2 | 32 | 0 | 0 | 0 |
| Glass composition | PbO | 71 | 71 | 71 | 80 | 75 |
| | $B_2O_3$ | 11 | 11 | 11 | 10 | 10 |
| | $SiO_2$ | 5 | 5 | 15 | 6 | 10.5 |
| | $TiO_2$ | 10 | 10 | 0 | 0 | 0 |
| | $ZrO_2$ | 1 | 1 | 0 | 0 | 0 |
| | $SnO_2$ | 1 | 1 | 0 | 0 | 0 |
| | $Al_2O_3$ | 1 | 1 | 3 | 0.5 | 1.5 |
| | $Ce_2O_3$ | 0 | 0 | 0 | 0.5 | 0 |
| | $Na_2O$ | 0 | 0 | 0 | 0 | 0.5 |
| | CaO | 0 | 0 | 0 | 3 | 0 |
| | SrO | 0 | 0 | 0 | 0 | 0 |
| | $P_2O_5$ | 0 | 0 | 0 | 0 | 2.5 |
| Crystallized crystals | Lead titanate | Present | Present | N.D. | N.D. | N.D. |
| | Lead zirconate | N.D. | N.D. | N.D. | N.D. | N.D. |
| | Lead borate | N.D. | N.D. | N.D. | N.D. | N.D. |
| | Lead stannate | N.D. | N.D. | N.D. | N.D. | N.D. |
| Terminal strength | | At least 20 kg | 5 mg | At least 20 kg | At least 20 kg | At least 20 kg |
| Resistivity ($\mu\Omega \cdot$ cm) | | 15 | 8 | 3 | 3 | 3 |
| Acid resistance | | ○ | X | ○ | ○ | ○ |
| Crystallinity (%) | | 88 | 10 | 0 | 0 | 0 |

With the conductive paste of the present invention, when the conductive paste is printed and fired on a glass plate, the low-melting glass frit constituting the conductive paste crystallizes crystals, whereby the resistivity can be increased while maintaining a dense tissue structure of silver. Thus, it provides an effect such that high resistivity can be realized while maintaining a dense sintered structure of silver without destruction of the silver tissue, and high bond strength can be obtained.

What is claimed is:

1. A conductive paste comprising (1) a conductive powder comprising at least silver, and (2) a low-melting glass frit, wherein the low-melting glass frit forms crystals at a crystallization temperature range of 570–700° C., said crystals are crystals of at least one member selected from the group consisting of lead titanate, lead zirconate, lead borate and lead stannate, and the sum of the amount of $TiO_2$, $ZrO_2$ and $SnO_2$ in said glass frit is 3–25 weight % based on the total weight of the glass frit.

2. The conductive paste according to claim 1, wherein the low-melting glass frit consists essentially of the following composition:

| | |
|---|---|
| PbO | 65 to 85 wt %, |
| $B_2O_3$ | 5 to 13 wt %, |
| $SiO_2$ | 2 to 7 wt %, |
| $TiO_2$ | 0 to 20 wt %, |

| -continued | |
|---|---|
| $ZrO_2$ | 0 to 15 wt %, |
| $SnO_2$ | 0 to 15 wt %, |
| $TiO_2 + ZrO_2 + SnO_2$ | 3 to 25 wt %, |
| $Al_2O_3 + Ce_2O_3$ | 0.1 to 2 wt %, |
| $Li_2O_3 + Na_2O + K_2O$ | 0 to 1 wt %, |
| $MgO + CaO + SrO + BaO$ | 0 to 5 wt %, and |
| $P_2O_5$ | 0 to 3 wt %. |

3. The conductive paste according to claim 1, which comprises from 70 to 99 wt % of the conductive powder, from 1 to 30 wt % of the low-melting glass frit and from 0 to 30 wt % of refractory filler powder.

4. The conductive paste according to claim 3, which further contains from 3 to 50 wt % of an organic vehicle.

5. The conductive paste according to claim 4, wherein the organic vehicle is an organic resin effective for imparting printability.

6. The conductive paste according to claim 5, wherein the organic resin is selected from the group consisting of an ethyl cellulose resin, an acrylic resin, a styrene resin and a phenol resin dissolved in a solvent selected from the group consisting of α-terpineol, butylcarbitol acetate, and a phthalic acid ester.

7. The conductive paste according to claim 1, wherein the conductive powder has an average particle size of at most 20 μm.

8. The conductive paste according to claim 1, which has been fired to form a conductor film on a window glass of an automobile.

9. The conductive paste of claim 1, wherein said conductor forms a strong bond to a metallic terminal.

* * * * *